United States Patent [19]
Forbes et al.

[11] Patent Number: 5,920,121
[45] Date of Patent: Jul. 6, 1999

[54] METHODS AND STRUCTURES FOR GOLD INTERCONNECTIONS IN INTEGRATED CIRCUITS

[75] Inventors: Leonard Forbes, Corvallis, Oreg.; Paul A. Farrar, So. Burlington, Vt.; Kie Y. Ahn, Chappaqua, N.Y.

[73] Assignee: Micron Technology, Inc., Boise, Id.

[21] Appl. No.: 09/030,188

[22] Filed: Feb. 25, 1998

[51] Int. Cl.⁶ .......................... H01L 23/48; H01L 23/52; H01L 29/40
[52] U.S. Cl. .......................... 257/742; 257/743; 257/522
[58] Field of Search .................. 257/742, 616, 257/743, 744, 745, 276, 522

[56] References Cited

U.S. PATENT DOCUMENTS

| | | | |
|---|---|---|---|
| 4,702,941 | 10/1987 | Mitchell et al. | 427/250 |
| 4,959,705 | 9/1990 | Lemnious | 257/522 |
| 5,148,260 | 9/1992 | Inoue et al. | 257/276 |
| 5,187,560 | 2/1993 | Yoshida et al. | 257/743 |
| 5,324,684 | 6/1994 | Kermani et al. | 437/95 |
| 5,341,016 | 8/1994 | Prall et al. | 257/412 |
| 5,371,035 | 12/1994 | Pfiester et al. | 437/69 |
| 5,470,801 | 11/1995 | Kapoor et al. | 437/238 |
| 5,510,645 | 4/1996 | Fitch et al. | 257/522 |
| 5,563,448 | 10/1996 | Lee et al. | 257/742 |
| 5,757,072 | 5/1998 | Gorowitz et al. | 257/522 |
| 5,801,444 | 9/1998 | Aboelfotah et al. | 257/742 |

FOREIGN PATENT DOCUMENTS

| | | | |
|---|---|---|---|
| 5-275682 | 10/1993 | Japan | 257/742 |

OTHER PUBLICATIONS

Berezhnoi, A., *Silicon and its Binary Systems*, Consultants Bureau, New York, 84, (1960).

Fukuda, Y., et al., "A New Fusible–Type Programmable Element Composed of Aluminum and Polysilicon", *IEEE Trans. on Electron Devices, ED–33*, 250–253, (Feb., 1986).

Hanna, J., et al., "Early Stage of Polycrystalline Growth of Ge and SiGe by Reactive Thermal CVD from GeF(4) and Si(2)H(6)", *Materials Res. Soc. Symp. Proc.*, 358, Boston, MA, 877–881, (Nov./Dec., 1994).

Hansen, P., *Constitution of Binary Alloys*, McGraw–Hill, New York, 103, (1958).

Hiraki, A., et al., "Formation of Silicon Oxide over Gold Layers on Silicon Substrates", *J. Applied Physics*, 43, 3643–3649, (Sep., 1972).

Hiraki, A., et al., "Low–Temperature Migration of Silicon in Metal Films on Silicon Substrates Studiedby Backscattering Techniques", *J. Vacuum Science and Tech.*, 9, 155–158, (Jan./Feb., 1972).

(List continued on next page.)

*Primary Examiner*—Valencia Martin-Wallace
*Assistant Examiner*—S. V. Clark
*Attorney, Agent, or Firm*—Schwegman, Lundberg, Woessner & Kluth, P.A.

[57] ABSTRACT

A typical integrated-circuit fabrication requires interconnecting millions of microscopic transistors and resistors with aluminum wires. Making the aluminum wires flush, or coplanar, with underlying insulation requires digging trenches in the insulation, and then filling the trenches with aluminum to form the aluminum wires. Trench digging is time consuming and costly. Moreover, aluminum has higher electrical resistance than other metals, such as gold. Accordingly, the invention provides a new "self-trenching" or "self-planarizing" method of making coplanar gold wires. Specifically, one embodiment forms a first layer that includes silicon and germanium; oxidizes a region of the first layer to define an oxidized region and a non-oxidized region; and reacts gold with the non-oxidized region. The reaction substitutes, or replaces, the non-oxidized region with gold to form gold wires coplanar with the first layer. Another step removes germanium oxide from the oxidized region to form a porous insulation having a very low dielectric constant, thereby reducing capacitance. Thus, the present invention not only eliminates the timing-consuming, trench-digging step of conventional methods, but also reduces resistance and capacitance which, in turn, enable faster, more-efficient integrated circuits.

17 Claims, 3 Drawing Sheets

OTHER PUBLICATIONS

Horie, H., et al., "Novel High Aspect Ratio Aluminum Plug for Logic/DRAM LSI's Using Polysilicon–Aluminum Substitute", *Technical Digest: IEEE Int. Electron Devices Meeting*, San Francisco, CA, 946–948, (1996).

Hurley, P., et al., "Low Temperature Plasma Oxidation of Polycrystalline Silicon", *Proc. 7th European Conf. on Insulating Films on Semiconductors: Contributed Papers*, Section 5, IOP Publishing Ltd., 235–238, (1991).

King, T., et al., "Deposition and Properties of Low–Pressure Chemical–Vapor Deposited Polycrystalline Silicon–Germanium Films", *J. Electrochemical Society*, 141, 2235–2241, (Aug. 1994).

Lee, D.H., et al., "Gate Oxide Integrity (GOI) of MOS transistors with W/TiN stacked gate", *1996 Symposium on VLSI Technology Digest of Technical Papers*, 208–209, (1996).

Li, C., et al., "Low Temperature Heteroepitaxial Growth of Si(1–x)Ge(x)–on–Si by Photo–Enhanced Ultra High Vacuum Chemical Vapor Chemical Vapor Deposition Using Si(2)H(6) and Ge(2)H(6)", *J. Electronic Materials*, 24, 875–884, (Jul. 1995).

Li, P., et al., "Formation of Stoichiometric SiGe Oxide by Electron Cyclotron Resonance Plasma", *Appl. Phys. Lett*, 60, 3265–3267, (Jun. 1992).

Lyman, T.e., "Metallography, Structure and Phase Diagrams", *Metals Handbook*, 8, American Society for Metals; Metals Park, Ohio, 253, 256, 260, 263,, (1989).

Moffatt, W., *The Handbook of Binary Phase Diagrams*, General Electric Company, pub., vol. 1, 3/84, (1978).

Mohajerzadeh, S., et al., "A Low Energy Ion Beam Assisted Deposition Technique for Realizaing iso–type SiGe/Si hetero–interface diodes", *Thin Solid Films*, 283, 182–187, (1996).

Mohajerzadeh, S., et al., "A Low–Temperature Ion Vapor Deposition Technique for Silicon and Silicon–Germanium Epitaxy", *Canadian J. Physics*, 74, S69–S73, (1996).

Mohri, M., et al., "Effect of SiF(4)/SiH(4)/H(2) Flow Rates on Film Properties of Low–Temperature Polycrystalline Silicon Films Prepared by Plasma Enchanced Chemical Vapor Deposition", *IEICE Transactions on Electronics*, E77–C, 1677–1684, (Oct. 1994).

Mukhopadhyay, M., et al., "Properties of SiGe Oxides Grown in a Microwave Oxygen Plasma", *J. Applied Physics*, 78, 6135–6140, (Nov. 1995).

Predel, B., et al., "Die Zustandsdiagramme Silber–Germanium–Silizium und Gold–Germanium–Silizium", *J. Less–Common Metals*, 44, 39–49, (Jan. 1976).

Schadel, H., et al., "Activity of Liquid Silver–Silicon Alloys", *Trans. American Institute of Mining and Metallurgical Engineers*, 188, 1282–1283, (Oct. 1950).

Ushiku, Y., et al., "Planarized Silver Interconnect Technology with a Ti Self–Passivation Technique for Deep Sub–Micron ULSIs", *1993 Symp. on VLSI Technology: Digest of Technical Papers*, 121–122, (1993).

Wu, S., et al., "Suppression of the Boron Penetration Induced Si/SiO2 Interface Degradation by Using a Stacked–Amorphous–Silicon Film as the Gate Structure for pMOSFET", *IEEE Electron Device Letters*, 15, 160–162, (May 1994).

METHODS AND STRUCTURES FOR GOLD INTERCONNECTIONS IN INTEGRATED CIRCUITS

BACKGROUND OF THE INVENTION

The present invention concerns methods of making, or fabricating, integrated circuits, particularly methods of forming gold interconnects.

Integrated circuits, the key components in thousands of electronic and computer products, are interconnected networks of electrical components fabricated on a common foundation, or substrate. Fabricators typically use various techniques, such as layering, doping, masking, and etching, to build thousands and even millions of microscopic resistors, transistors, and other electrical components on a silicon substrate, known as a wafer. The components are then "wired," or interconnected, together to define a specific electric circuit, such as a computer memory or microprocessor.

Interconnecting millions of microscopic components typically entails covering the components with an insulative layer, digging small holes in the insulative layer to expose portions of the components underneath, and digging trenches from each hole to one or more other holes in the layer. Then, through metallization, the holes and trenches are filled with aluminum (or an aluminum alloy) to form aluminum interconnects, or wires, between the components.

To fill the trenches and holes, fabricators cover the entire insulative layer with a thin layer, or film, of aluminum, and then selectively dissolve, or etch, away the aluminum that lies outside the holes and trenches. The selective etching requires the use of photolithography, a photographic-patterning technique, to form an etch-resistant mask, which protects the aluminum-filled holes and trenches from the etchant. The resulting aluminum wires, intended to be flush, or coplanar, with the surface of the underlying insulative layer, are typically about one micron thick, or about 100 times thinner than a human hair.

These conventional interconnection techniques suffer from at least three significant shortcomings. First, because of the difficulty of using photolithography to form high-precision masks on bumpy, uneven surfaces, conventional techniques require digging trenches to ensure that the deposited aluminum wires are flush, or coplanar, with the surface of the underlying insulation. However, digging these trenches is a time-consuming step which ultimately increases the cost of manufacturing integrated circuits.

Secondly, conventional techniques produce wires of aluminum, which not only has a higher electrical resistance, but also a lower electromigration resistance than other metals, such as gold. High electrical resistance wastes power, and low electromigration resistance means that, at certain electric current levels, the aluminum readily diffuses, or migrates, into neighboring structures, eventually thinning or breaking the wires and thus undermining reliability of integrated circuits.

Moreover, although gold has a 13-percent lower electrical resistivity and at least 100-percent higher electromigration resistance than aluminum, conventional interconnection techniques are impractical for making gold interconnects. In particular, gold, a noble metal, is immune to most etchants. In fact, attempts to selectively etch a layer of gold covered with an etch-resistant mask usually dissolve the mask, not the gold. Thus, conventional etch-based techniques are wholly inadequate to form gold interconnects.

Thirdly, in addition to being time-consuming because of the trench-digging step and ineffective with more desirable metals such as gold, conventional techniques place aluminum wires in relatively high-capacitance insulators, typically solid silicon oxide. High capacitance slows the response of integrated circuits to electrical signals, a great disadvantage in computers and other systems including the integrated circuits.

Accordingly, there is not only a need for new interconnection methods that eliminate the trench-digging step, but also methods that yield less-resistive, less-capacitive, and more-reliable gold-based interconnects for faster and more-efficient integrated circuits.

SUMMARY OF THE INVENTION

To address these and other needs, the present invention provides a new method of making coplanar gold and insulative structures for an integrated circuit. Specifically, one embodiment of the method entails forming a first layer that includes silicon and germanium, and then oxidizing a region of the first layer to define an oxidized region and a non-oxidized region. After oxidation, the method reacts gold with the non-oxidized region. The reaction substitutes, or replaces, the non-oxidized region with gold to form a gold structure flush or coplanar with the first layer. Another step removes germanium oxide from the oxidized region to surround the gold structure in a porous insulative member which reduces capacitance.

Thus, the method of the present invention yields a self-planarizing gold structure that not only eliminates the time-consuming, trench-digging step of conventional methods, but also places the low-resistance, highly-reliable gold structure within a capacitance-reducing insulation that allows faster, more-efficient integrated circuits.

BRIEF DESCRIPTION OF THE DRAWINGS

The following figures are used to describe many aspects of the invention.

DESCRIPTION OF THE PREFERRED EMBODIMENTS

The following detailed description, which references and incorporates FIGS. 1–10, describes and illustrates specific embodiments of the invention. These embodiments, offered not to limit but only to exemplify and teach the invention, are shown and described in sufficient detail to enable those skilled in the art to implement or practice the invention. Thus, where appropriate to avoid obscuring the invention, the description may omit certain information known to those of skill in the art.

The detailed description includes two sets of separate but overlapping embodiments of the invention. The first set of embodiments, illustrated principally with FIGS. 1–8, pertains to a preferred method of making single- and multi-level interconnective structures. The second set of embodiments, illustrated principally with FIGS. 9 and 10, concern hybrid interconnect structures which combine air bridges with structures exemplified in the first set of embodiments.

Preferred Method of Making Single- and Multi-Level Interconnects

Figure 1:
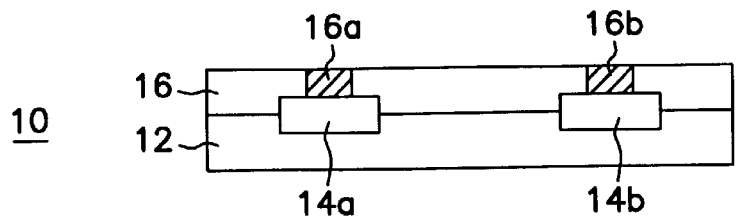
FIG. 1 is a cross-sectional view of an integrated-circuit assembly.

FIGS. 1–8 show a number of preferred integrated-circuit assemblies, which taken collectively and sequentially, illustrate the preferred method of the present invention. The method, as shown in FIG. 1, begins with a known integrated-circuit assembly or structure 10. Assembly 10 includes a substrate 12. The term "substrate" encompasses a semiconductor wafer as well as structures having one or more insulative, conductive, or semiconductive layers and materials. Thus, for example, the term embraces silicon-on-insulator, silicon-on-sapphire, and other advanced structures.

Substrate 12 supports a number of integrated elements 14, preferably transistors 14a and 14b. Transistors 14a and 14b are covered by an insulative layer 16, which preferably comprises silicon oxide, nitride, or oxynitride. Layer 16 includes two aluminum vias 16a and 16b electrically connected to respective transistors 14a and 14b. Although omitted from FIGS. 1–8 for clarity, assembly 10 preferably includes a titanium-nitride diffusion barrier between vias 16a and 16b and transistors 14a and 14b.

Figure 2:
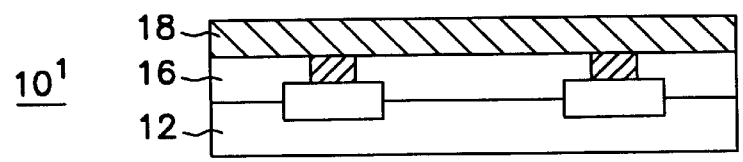
FIG. 2 is a cross-sectional view of the FIG. 1 integrated-circuit assembly after formation of a silicon-germanium layer.

Next, as FIG. 2 shows, the preferred method forms a polycrystalline, silicon-germanium (SiGe) layer 18 on insulative layer 16 and over vias 16a and 16b. In the preferred embodiment, silicon-germanium layer 18 consists of 10–60 percent germanium (by weight). Because of the low solubility of silicon in gold, compared to silicon in germanium, as well as to produce a low-dielectric insulator, a high germanium content, such as 50 percent, is preferred. The thickness of the silicon-germanium layer, approximately one micron, matches the thickness of the desired gold structure.

Silicon-germanium layer 18 is preferably formed through ion-beam vapor deposition, a process which occurs around 300° C. For further details, refer to S. Mohajerzadeh "A Low Temperature Ion Vapor Deposition Technique for Silicon and Silicon Germanium Epitaxy" (Canadian Journal of Physics, Vol. 74, Supplement, no. 1, pp. s69–73, 1996), which is incorporated herein by reference. Another embodiment uses a 250° C. photo-enhanced, vapor-deposition technique, such as that disclosed in C. Li, "Low Temperature Heteroepitaxial Growth of $Si_{1-x}Ge_x$-on-Si by Photo-Enhanced Ultra High Vacuum Chemical Vapor Deposition Using $Si_2H_6$ and $Ge_2H_6$" (Journal of Electronic Materials, vol. 24, no.7, pp. 875–884, 1992). This article is also incorporated by reference.

Figure 3A:
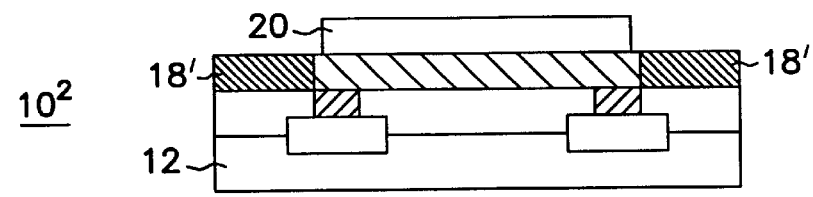
FIG. 3A is a cross-sectional view of the FIG. 2 integrated-circuit assembly after formation of an oxidation mask.
Figure 3B:
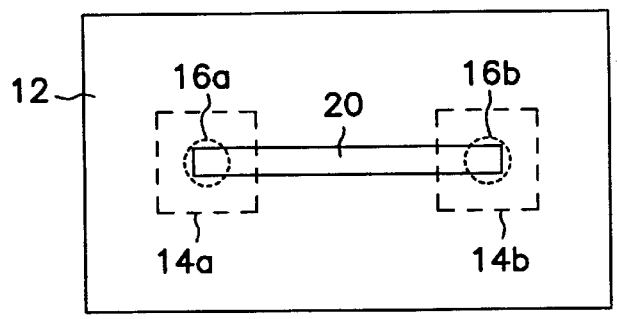
FIG. 3B is a top view of the FIG. 3A integrated-circuit assembly, showing the oxidation mask.

In FIG. 3A, the method forms an oxidation mask 20 on silicon-germanium layer 18. This mask defines a narrow, rectangular channel which ultimately defines the periphery of a conductor connecting vias 16a and 16b and thus transistors 14a and 14b. A top view of mask 20 and its relation to transistors 14a and 14b and vias 16a and 16b is shown in FIG. 3B.

To form mask 20, the method deposits a layer of silicon nitride ($Si_3N_4$), using low-pressure or plasma-enhanced chemical-vapor deposition. Conventional lithographic techniques define the mask, finally formed through reactive-ion or plasma etching of the silicon-nitride layer. The actual mask thickness, which preferably ranges between 30 and 100 nanometers, depends on the etchant used to remove the unwanted silicon nitride.

After completion of mask 20, the method oxidizes silicon-germanium layer 18. This oxidization defines regions under mask 20 as non-oxidized regions and unmasked regions as oxidized regions. The oxidized regions contain an extractable or removable germanium oxide, which can be removed to leave a porous insulator having a low dielectric constant. The non-oxidized regions eventually become the metallic or conductive member connecting transistors 14a and 14b. In the preferred embodiment, the oxidation is microwave-plasma-enhanced to occur at temperatures as low as 200° C. The results of oxidation are shown as regions 18' in FIG. 3A.

Figure 4:
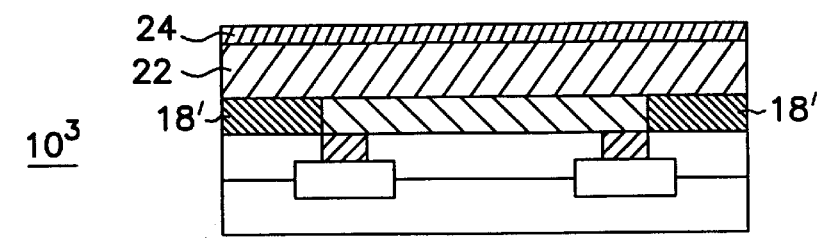
FIG. 4 is a cross-sectional view of the FIG. 3 integrated-circuit assembly after oxidation, removal of the oxidation mask, and formation of a gold layer and a zirconium layer.
Figure 5:
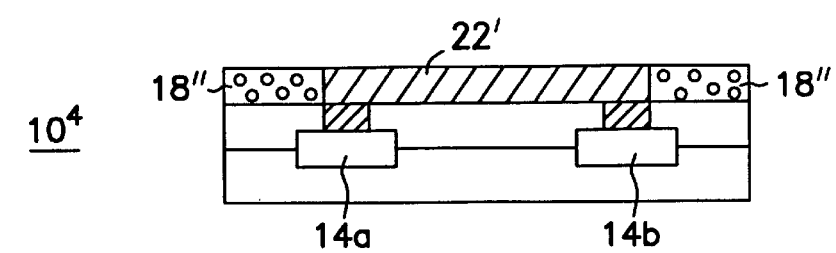
FIG. 5 is a cross-sectional view of the FIG. 4 assembly after reaction of the gold layer and the silicon-germanium layer.

In FIG. 4, the method entails removing mask 20, preferably through reactive-ion etching, chemical etching, or chemical-mechanical polishing, to leave silicon-germanium layer 18 with a planar surface for depositing gold. Afterward, physical or chemical-vapor deposition forms a 1.5-micron-thick, gold layer 22 on the oxidized and non-oxidized regions of layer 16.

Next, the method forms a 200-nanometer-thick, zirconium layer 24 on layer 18 by physical vapor deposition. In other embodiments, layer 24 is between 20 and 250 nanometers thick and comprises titanium or hafnium, instead of zirconium. Zirconium is preferred because of its lower solubility in gold. Layer 24 not only reduces the temperature and time necessary to complete the next step, but also improves the contact resistance between the gold layer and any subsequent metallization level.

The next step forces a metal-substitution reaction between gold layer 22 and the non-oxidized regions of silicon-germanium layer 18, thereby substituting, or replacing, the non-oxidized regions of silicon-germanium layer 20 with gold from gold layer 22. Consequently, a coplanar (or at least partially submerged) metallic structure 20', consisting essentially of gold with small amounts of silicon and germanium, forms in silicon-germanium layer 20. Thus, unlike conventional techniques that require trench-digging before metal deposition to ensure co-planarity of the metallic structures and underlying insulative structures, the present method is "self-planarizing" or "self-trenching."

More specifically, to force the metal-substitution reaction, the method heats the integrated-circuit assembly to 300° C. in a vacuum, nitrogen, argon, forming-gas or other non-oxidizing atmosphere for approximately 60 minutes. Heating causes diffusion of the non-oxidized regions of metal layer 20 into adjacent portions of silicon-germanium layer 18 and vice versa. The substitution temperature, that is, the annealing temperature, should be lower than 326° C., which is the eutectic (lowest melting) temperature of the ternary gold-silicon-germanium system for the reaction or substitution to occur.

After the metal-substitution reaction, a small amount of germanium may remain on gold structure 20'. Additionally, any gold that remains on the surface of layer 20 may contain zirconium silicide and silicon-germanium agglomerates. These are removed by chemical mechanical polishing or other suitable techniques.

Then, to reduce the dielectric constant of oxidized regions 18', germanium oxide in the oxidized regions of silicon-germanium layer 20 is removed using a wet etchant, such as distilled or deionized water. This leaves a porous oxide, insulative structure having a dielectric constant about one half that of conventional solid oxide insulators. (However, this reduction in dielectric constant depends on the original composition of silicon-germanium layer 20, which in the preferred embodiment is 50 percent germanium.) The lowered dielectric constant ultimately reduces capacitance which, in turn, yields a faster, more efficient integrated circuit.

Figure 6A:
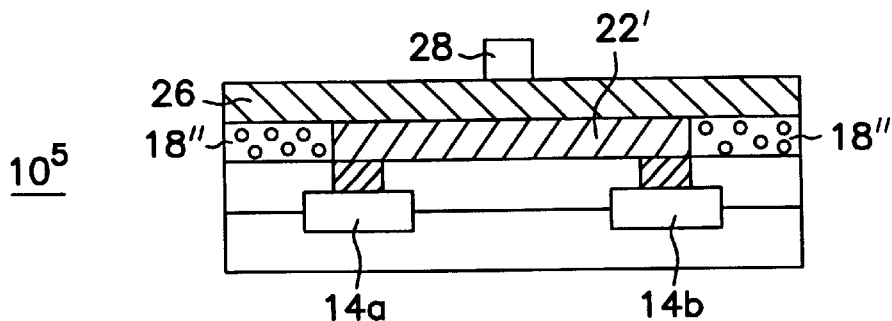
FIG. 6A is a cross-sectional view of the FIG. 5 integrated-circuit assembly; assembly after formation of a silicon-germanium layer and an oxidation mask.
Figure 6B:
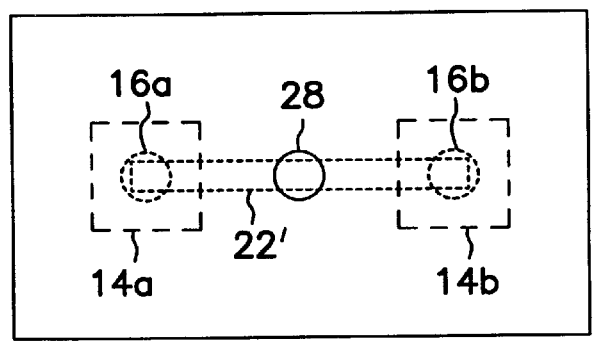
FIG. 6B is a top view of the FIG. 6A integrated-circuit assembly, showing the oxidation mask.
Figure 7:
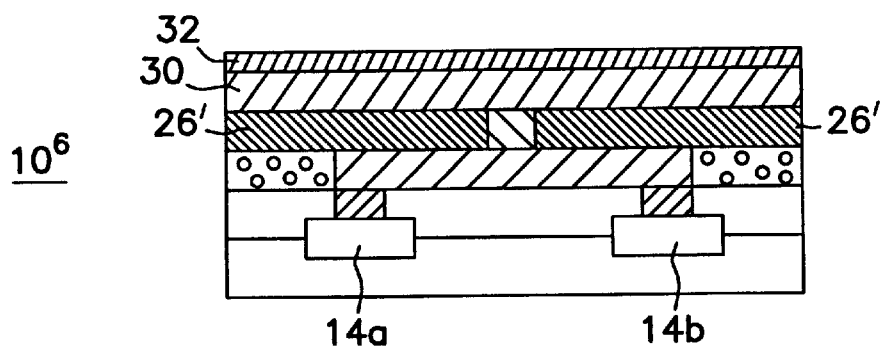
FIG. 7 is a cross-sectional view of the FIG. 6 integrated-circuit assembly after oxidation, removal of the oxidation mask, and formation of a gold layer and a titanium layer.

Further fabrication of more interconnection or metallization levels would entail repeating the steps already described and illustrated. For example, to form a second level that includes a via, the preferred embodiment, illustrated in FIG. 6A, forms a second silicon-germanium layer 26 and then an oxidation mask 28 defining a position of the via relative conductor 22'. FIG. 6B shows a top view of mask 28 and its position relative conductor 22'. After oxidizing silicon-germanium layer 26 and then removing oxidation mask 28, the method forms a second gold layer 30 and a second zirconium layer 32 as FIG. 7 shows. The integrated-circuit assembly is then heated to force the metal-substitution reaction, thereby substituting a portion of gold layer 30 for non-oxidized region of layer 26, and forming a substantially coplanar via 30'.

Notably, unlike conventional techniques that require forming an insulative layer, etching holes to define the vias, and then finally filling these holes with metal to form the vias, this technique proceeds without etching holes and without filling holes. Thus, the present invention provides an "etchless" or "hole-less" method of forming vias.

Figure 8:
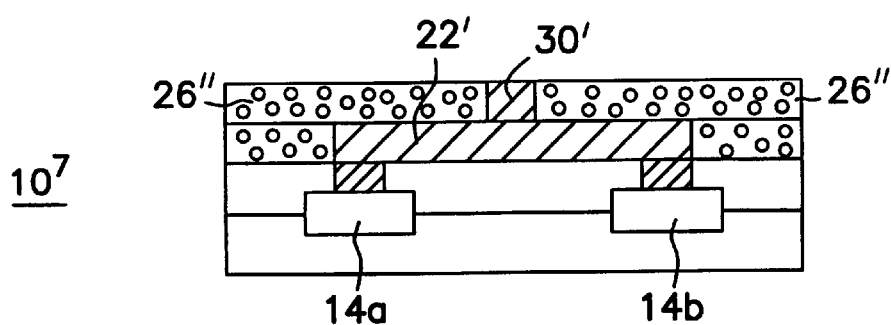
FIG. 8 is a cross-sectional view of the FIG. 7 assembly after reaction of the gold layer and the silicon-germanium layer.

After forming via 30', wet etching removes germanium oxide from regions 26' to form porous low-dielectric insulation around via 30'. The resulting integrated-circuit assembly is depicted in FIG. 8. Subsequent metallizations would follow similarly. (However, one should take care to ensure that both the deposition and oxidation temperatures for subsequent silicon-germanium layers are lower than the substitution temperature, 300° C. in the preferred embodiment, to avoid causing substitution from underlying gold structures.)

With completion of the desired number of metallization levels, the preferred method ultimately concludes by heat-treating the integrated circuit for one to six hours at a temperature between 100 and 200° C. This heat treatment, which preferably occurs after packaging the integrated circuit in a protective housing, ensures that the metallic structures have minimum resistivity.

Preferred Hybrid Interconnects Incorporating Low-Capacitance Air Bridges

Figure 9:
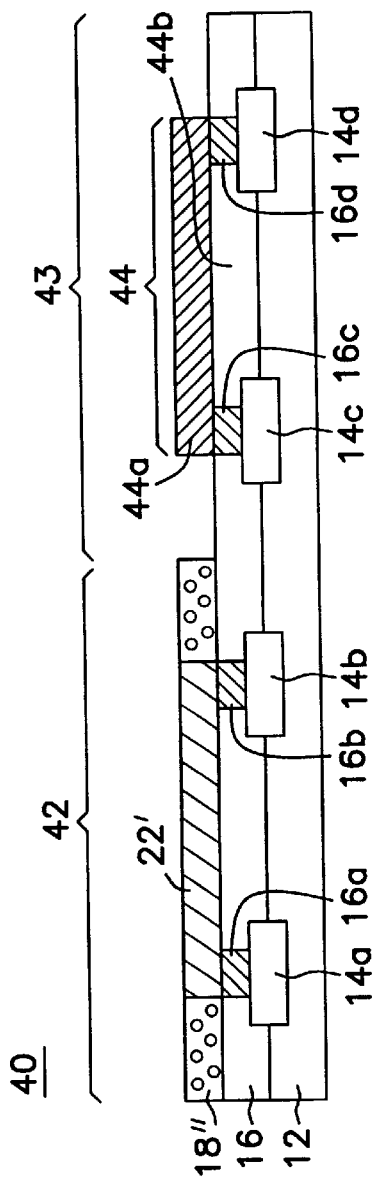
FIG. 9 is a cross-sectional view of an integrated-circuit assembly embodying a coplanar hybrid interconnect system.
Figure 10:
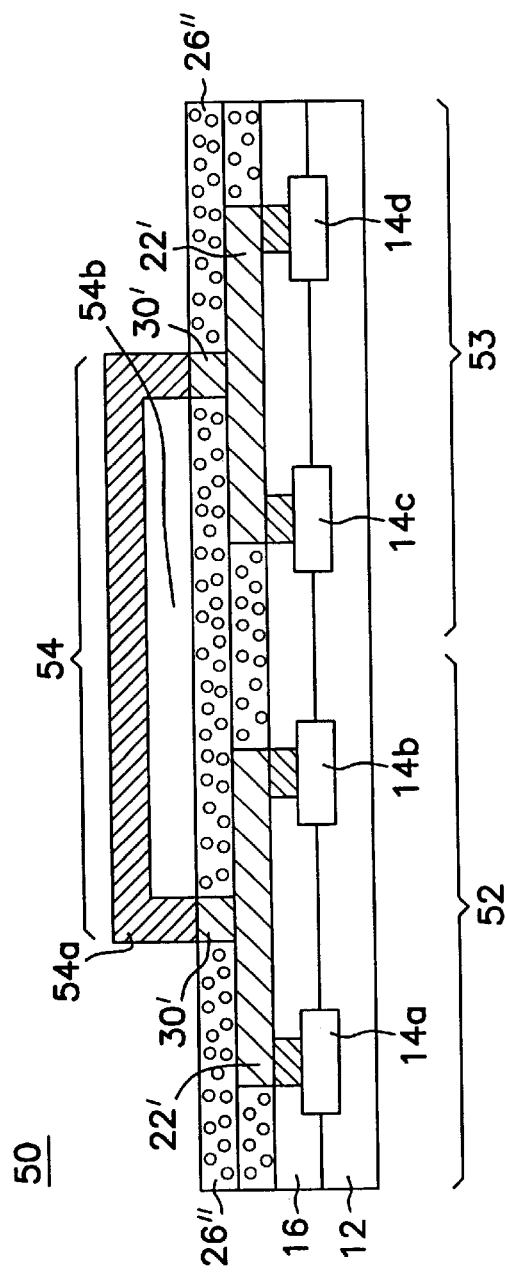
FIG. 10 is a cross-sectional view of an integrated-circuit assembly embodying a two-level (non-coplanar) hybrid interconnect system.

FIGS. 9 and 10 show two integrated-circuit assemblies which respectively combine the low-capacitance structures of FIGS. 3 and 8 with low-capacitance air bridges to yield new hybrid structures. In particular, FIG. 9 shows an integrated-circuit assembly 40 embodying a coplanar hybrid interconnect system which combines two distinct types of low-capacitance interconnect structures: a first interconnect structure 42 (on the left), and a second interconnect structure 43 (on the right). Structure 42, identical to the previously described structure of FIG. 3, connects transistors 14a and 14b on substrate 12 via conductive vias (or contacts) 16a and 16b and aluminum conductor 22'. For reduced capacitance, conductor 22' is embedded in porous insulation 18" which has a low dielectric constant. Structure 42 is preferably formed as detailed through the above description of FIGS. 1–3.

Interconnect structure 43 comprises an air bridge 44, which in turn comprises an aluminum conductor 44a and air cavity 44b. Conductor 44a, which is substantially coplanar to conductor 22', electrically connects vias 16c and 16d and thus electrically connects corresponding transistors 14c and 14d. The presence of air cavity 44b, which has a unity or near-unity dielectric constant lower than even that of porous insulation 18", minimizes line capacitance between these transistors.

Air bridge 44 is built conventionally by forming conductor 44a on an underlying, sacrificial support structure (not shown) and then removing the support structure to leave air cavity 44b. In conventional processing, the sacrificial support structure consists of photoresist or other material which can be easily dissolved or etched away. For further details on this known process, see U.S. Pat. No. 5,510,645 entitled Semiconductor Structures Having an Air Region and Method of Forming the Semiconductor Structure and U.S. Pat. No. 5,324,684 entitled Method of Forming Semiconductor Structure Having an Air Region, both to Fitch et al. and both incorporated herein by reference.

Fabrication of air bridge 44 may occur before, after, or concurrent with the fabrication of structure 42. For example, vias 16c and 16d may be formed simultaneously with vias 16a and 16b or started during the metal substitution reaction that forms conductor 22'. However, one should take care to avoid exceeding the substitution temperature; otherwise undesired substitution of silver may occur.

FIG. 10 shows an integrated-circuit assembly 50 embodying a two-level (non-coplanar) hybrid interconnect system which, like assembly 40, combines two types of low-capacitance interconnect structures. Assembly 50 includes an air bridge 54 which connects integrated-circuit assemblies 52 and 53. Assemblies 52 and 53, both of which are structurally identical to the previously described assembly of FIG. 8, embed aluminum conductors 22' in porous insulation 26". Conductors 22" are connected to vias 30', which are electrically connected via air bridge 54.

Air bridge 54 comprises aluminum conductor 54a and air cavity 54b. Conductor 54a, which occupies a plane above that of conductors 22', electrically connects vias 30' and thus electrically connects transistors 14a and 14b to transistors 14c and 14d. Air bridge 54 as well as assemblies 52 and 53 are fabricated according the methods described above.

CONCLUSION

The present invention overcomes at least three significant shortcomings of conventional interconnection techniques. First, unlike previous techniques that require digging trenches in an insulative layer before metallization to ensure a coplanar metallic structure, the invention provides a self-planarizing or self-trenching metallization process, which directly substitutes metal for select portions of an insulative layer, thereby skipping the time-consuming trench-digging step. Relatedly, the invention forms vias without the conventional steps of etching and filling holes with metal.

Second, unlike conventional techniques which are limited to forming interconnects from aluminum, the invention forms interconnects from gold, which has 13-percent lower electrical resistance and at least 100-percent higher electromigration resistance. Thus, the invention yields integrated circuits with superior efficiency and reliability.

Third, unlike conventional techniques that bury aluminum wiring in solid high-capacitive insulation, the invention submerges or embeds gold wiring in porous low-capacitive insulation which ultimately yields faster integrated circuits. In short, the invention not only eliminates the time-consuming, trench-digging step, but also yields integrated circuits that operate with superior speed, reliability, and economy.

The embodiments described above are intended only to illustrate and teach one or more ways of practicing or implementing the present invention, not to restrict its breadth or scope. The actual scope of the invention, which embraces all ways of practicing or implementing the invention, is defined only by the following claims and their equivalents.

We claim:

1. An integrated-circuit assembly comprising:
   first and second integrated devices;
   a first layer including first and second conductive members contacting the respective first and second integrated devices;
   a silicon-germanium layer having oxidized and non-oxidized regions, with the non-oxidized region contacting the first conductive member; and
   a gold layer contacting at least a portion of the non-oxidized region.

2. The integrated-circuit assembly of claim 1, further comprising:
   a titanium, zirconium, or hafnium layer contacting the gold layer.

3. An integrated-circuit assembly comprising:
   an air bridge having a first conductor and a cavity adjacent the first conductor; and
   a gold conductor at least partially submerged in a porous insulator, the gold conductor electrically coupled to the first conductor.

4. The integrated-circuit assembly of claim 3, wherein the porous insulator consists essentially of a silicon oxide.

5. An assembly for an integrated circuit, comprising:
   a supporting surface;
   first and second transistor regions supported by the supporting surface;
   a first interconnect structure supported by the supporting surface and including a gold conductor, the gold conductor at least partially submerged in a porous insulator, positioned in a first horizontal plane above and substantially parallel to the supporting surface, and electrically coupled to the first transistor region; and
   a second interconnect structure supported by the supporting surface and including an air-bridge conductor, the air-bridge conductor positioned in a second horizontal plane and electrically connected to the gold conductor and the second transistor region.

6. The assembly of claim 5, wherein the second horizontal plane is above the first horizontal plane, or the first and second horizontal planes are substantially similar.

7. The integrated-circuit assembly of claim 1, wherein the silicon-germanium layer comprises a silicon alloy having between 10 and 60 percent germanium.

8. The integrated-circuit assembly of claim 1 wherein the silicon-germanium layer is positioned between the first layer and the gold layer.

9. The integrated-circuit assembly of claim 1 wherein the silicon-germanium layer is substantially planar.

10. The integrated-circuit assembly of claim 3 wherein at least a portion of the first conductor is suspended over the cavity.

11. The integrated-circuit assembly of claim 3 wherein the cavity is filled with air.

12. The integrated-circuit assembly of claim 3, wherein the first conductor comprises gold.

13. The assembly of claim 3 wherein the gold conductor is substantially flush or coplanar with the porous insulator.

14. The integrated-circuit assembly of claim 3 further comprising one or more transistors electrically coupled to the gold conductor.

15. The assembly of claim 5 wherein the porous insulator consists essentially of a silicon oxide.

16. The assembly of claim 5 wherein the gold conductor is substantially flush or coplanar with the porous insulator.

17. An integrated-circuit assembly comprising:
   first and second integrated devices;
   a first layer including first and second conductive members contacting the respective first and second integrated devices;
   a silicon-germanium layer comprising a silicon alloy having between about 10 and about 60 percent germanium and having oxidized and non-oxidized regions, with the non-oxidized region contacting the first conductive member;
   a gold layer contacting at least a portion of the non-oxidized region; and
   a titanium, zirconium, or hafnium layer contacting the gold layer.

* * * * *